United States Patent [19]

Tsang

[11] Patent Number: 4,737,960
[45] Date of Patent: Apr. 12, 1988

[54] RARE EARTH DOPED SEMICONDUCTOR LASER

[75] Inventor: Won-Tien Tsang, Holmdel, N.J.

[73] Assignee: American Telephone and Telegraph Company, AT&T Bell Laboratories, Murray Hill, N.J.

[21] Appl. No.: 911,976

[22] Filed: Sep. 26, 1986

[51] Int. Cl.$^4$ ............................................. H01S 3/19
[52] U.S. Cl. ....................................... 372/45; 357/17; 357/61; 357/63; 372/46; 372/704
[58] Field of Search ..................... 372/43, 44, 45, 46, 372/704; 357/17, 61, 63

[56] References Cited

U.S. PATENT DOCUMENTS 4,081,763  3/1978  Vlasenko et al. .................. 372/43
4,193,044  3/1980  Morrison et al. ................ 178/92 R
4,637,025  1/1987  Snitzer et al. ....................... 372/1

OTHER PUBLICATIONS

Appl. Phys. Let. 45, 15 Nov., 1984, "A New High-Power, Narrow-Beam . . . ", W. T. Tsang et al., pp. 1025–1027.
Appl. Phys. Let. 46, 15 Feb., 1985, "1.54-$\mu$m Electroluminescence of Erbium-Doped Silicon . . . ", H. Ennen, et al., pp. 381–383.
Appl. Phys. Let. 46, 1 May, 1985, "Ytterbium-Doped InP Light-Emitting Diode at 1.0 $\mu$m", W. H. Haydl et al., pp. 870–872.
J. App. Phys., 59, 15 Jan., 1986, "Photoluminescence Optimization and Characteristics of the Rare-Earth . . . ", G. S. Pomrenke et al., pp. 601–610.
J. App. Phys., 59, 15 Feb., 1986, "Neodymium Complexes in GaP Separated by Photoluminescence Excitation Spectroscopy", J. Wagner et al., pp. 1202–1204.

Primary Examiner—James W. Davie
Assistant Examiner—Georgia Y. Epps
Attorney, Agent, or Firm—Daniel D. Dubosky; Oleg E. Alber

[57] ABSTRACT

A solid state laser is disclosed wherein a semiconductor active layer is arranged in a Fabry-Perot cavity and the active layer is doped with a rare earth ion having a dominant emission wavelength. The proportion of elements for the compound active layer is chosen such that the bandgap corresponds to a wavelength which is longer than the emission wavelength of the rare earth ion. In the specific embodiment disclosed, the quarternary semiconductor compound is gallium indium arsenide phosphide and the rare earth ion is erbium.

10 Claims, 6 Drawing Sheets

RARE EARTH DOPED SEMICONDUCTOR LASER

This invention relates to semiconductor lasers and more particularly to semiconductor lasers that use rare earth dopants as the wavelength determining elements.

BACKGROUND OF THE INVENTION

Rare earth ions have been utilized in insulating crystals as the gain media for laser operations. These ions have also been incorporated into III-V semiconductor materials and into silicon in order to provide gain media in prior art laser systems. In these systems photo luminescense bands arising from the intra-center 4f—4f transitions between crystal field split spin-orbit levels of the tri-valent rare earth ions were observed at low temperatures, typically less than or equal to 77K. The wavelength of the observed emissions were found to not depend on the bandgap energy of the host semiconductor material, but rather to depend on the particular rare earth ion which was used as the dopant.

In all of the prior art systems the rare earth ions were always chosen to have a main emission wavelength which was longer than the bandgap emission wavelength of the host semiconductor material. Some of the combinations which have been studied in the prior art are as follows: erbium in GaAs, GaP, InP and Si; Neodymium, Samarium and Europium in GaP; and ytterbium in InP, GaP, and GaAs. These prior art systems can be depicted by the electron energy diagram shown in FIG. 2. FIG. 2 is an electron energy vs density of states diagram for a typical rare-earth-doped semiconductor material of the prior art where a rare earth element has been used as the dopant. As shown in FIG. 2, the energy transition (203-204) for the rare earth ion is smaller than the energy difference (205-206) for the bandgap of the semiconductor material. Accordingly, the emission wavelength for the rare earth transition is longer than the wavelength corresponding to the bandgap of the semiconductor material. As pointed out in U.S. Pat. No. 4,193,044 to C. A. Morrison et al., dated Mar. 11, 1980, the host semiconductor material in a rare earth semiconductor laser was required to have "a bandgap wide enough to be transparent to light emitted by the lasing ions".

Because the rare earth energy levels lie within the semiconductor bandgap, the electron transitions between the 4f—4f levels involves electrons which relax from the conduction band to the upper level of the rare earth ion, followed by a radiative transition 201 to the lower level of the rare earth ion, and finally by a relaxation to the valence band of the semiconductor material. Such a multi-process transition is in general less probable than the direct band-to-band transition designated as 202 in FIG. 2. As a result, the luminesecence efficiency of the rare earth transitions is extremely low and hence these transitions result in poor optical gain as indicated in FIG. 3. Accordingly, no lasing action at the rare-earth ion transition wavelength has been actually achieved in such prior art systems. As further indicated in FIG. 3, the gain for the rare earth transition and the gain for the band-to-band transitions are at distinctly different wavelengths.

Alternatively, the higher energy emission resulting from the band-to-band transition 202 of the host semiconductor material can optically pump electrons from the low level of the rare earth ion to energies higher than the upper level. Relaxation of the electrons from these higher energy levels to the upper level of the rare earth ion results in radiative transitions 207 from upper level to the lower level thereby emitting a photon at the longer wavelength. This process of pumping at the higher energy is still inefficient when compared with the direct band-to-band transition because it is a non-resonant pumping process. In both cases which result in emission from transitions between the rare earth levels, the pumping of the rare earth transition is of a non-resonant type. The quantum efficiency, i.e., conversion efficiency of input pumping power to output optical power, achieved in all of these prior art systems was in the order of $10^{-4}$.

SUMMARY OF THE INVENTION

Increased efficiency and a narrower band of output wavelengths are achieved in accordance with the present invention wherein a rare earth ion is utilized as a dopant in a semiconductor host material and the rare earth is chosen such that the dominant emission from rare earth ion transition is shorter in wavelength than that of the bandgap emission of the host semiconductor material. Preferably, the rare earth material and semiconductor host material should be chosen so that the rare earth energy levels corresponding to the dominant emission are aligned in energy at the highest carrier density points.

In the specific embodiment constructed in accordance with the present invention, erbium is chosen as the rare earth dopant in a laser having a quaternary layer of gallium indium arsenide phosphide (GaInAsP). This quaternary layer was surrounded by a wide gap cladding layer of indium phosphide in a heteroepitaxial ridge overgrown laser structure. The erbium has an intra-center $4_{I13/2} - 4_{I15/2}$ transition with an emission at 1.53 μm, and the materials at the quaternary GaInAsP were chosen to have a bandgap corresponding to an emission of 1.55 μm.

BRIEF DESCRIPTION OF THE DRAWING

The invention will be more readily understood after reading the following detailed description in conjunction with the drawings wherein.

DETAILED DESCRIPTION

Figure 4:
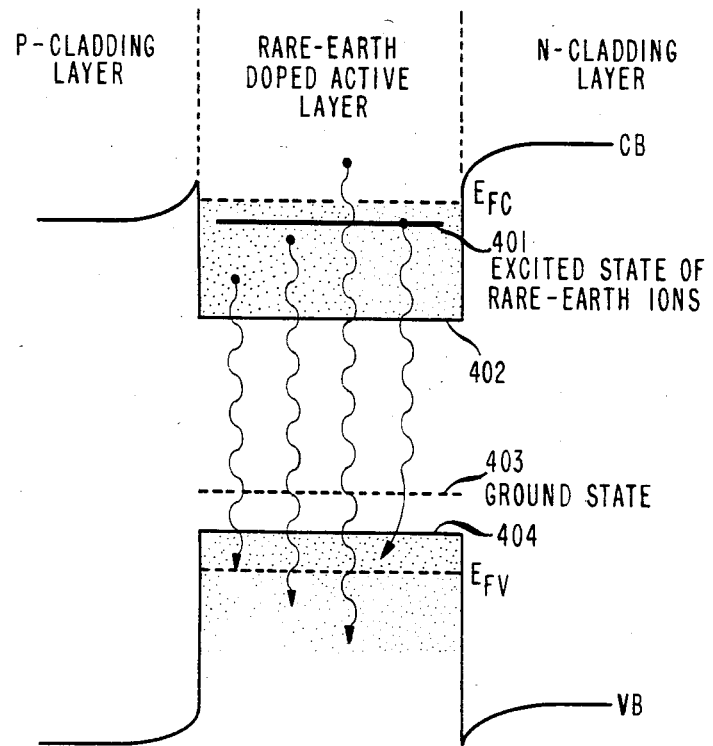
FIGS. 4 through 9 are energy diagrams, an optical gain plot, and other curves which are useful in describing the operation of the present invention.
Figure 5:
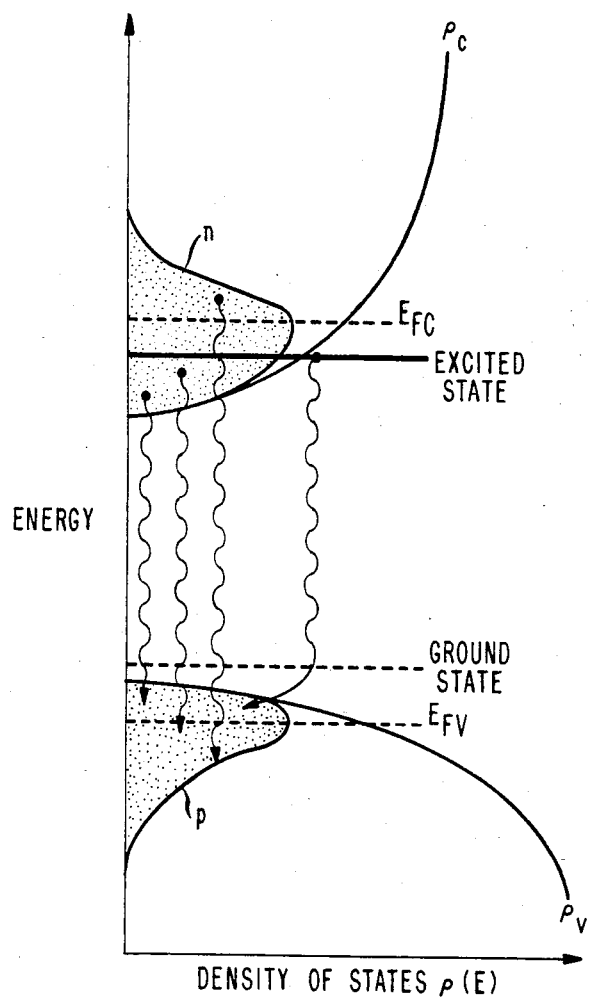

In accordance with the present invention, rare earth elements and the composition of the semiconductor layers in which they are to be used as dopants are chosen such that the wavelength of the dominant emission from the rare earth ion transitions is shorter than that of emission corresponding to the bandgap of the host semiconductor layer as depicted in FIGS. 4 and 5. In FIG. 4, a double-heterostructure (DH) laser with a built-in pn junction for carrier injection into the active layer is shown under high injection level. As a result, the quasi-Fermi level for electrons ($E_{FC}$) and for holes ($E_{FV}$) lie within the conduction band and valence band, respectively, as depicted in FIG. 5. In the embodiment illustrated, the upper level 401 (excited state) of the rare earth ion lies above the conduction-band edge 402 of the host semiconductor, while the lower level 403 (ground state) of the rare earth ion lies just above or below the valence-band edge 404.

Figure 6:
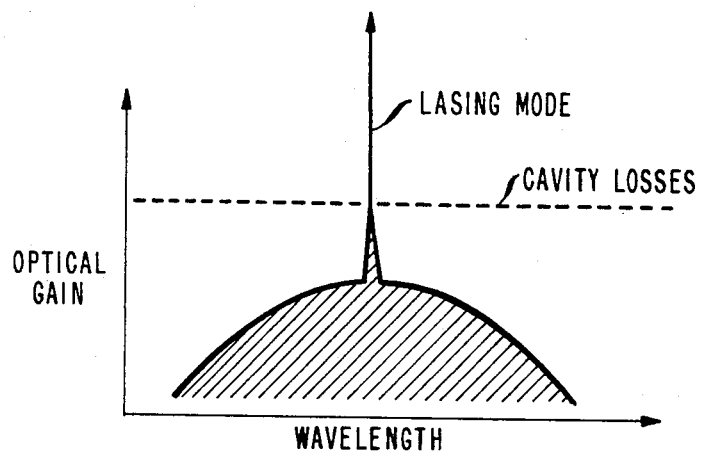

Although there exists no firm experimental data on the relative position on the rare earth energy levels with respect to the band edges of the semiconductor, it is mainly the differences in energy which are important in the present invention. Their relative positions can be deduced from the following observations. Since the outer-shell electron configuration of most rare earths is the same as that of the group IIA element barium, $5S^25p^66S^2$, a rare earth impurity substituting for an unperturbed group III lattice atom should behave as a single acceptor. Therefore, the lower level 403 of the rare earth ion should be close to the valence-band edge 404 of the host semiconductor, and remains unoccupied by electrons because the $E_{FV}$ under high injection at lasing is below the valence-band edge as shown in FIG. 5. The composition of the host semiconductor is adjusted so that the upper level 401 of rare earth ion is above the conduction-band edge 402 and preferably close to the $E_{FC}$ as shown in FIG. 5. Such a combination of rare earth dopant and semiconductor material composition leads to the following two important consequences. (1) The transfer of electrons from the conduction-band to the excited state of the rare earth ion is by a resonant process, and the upper level 401 is located close to an energy where the electron density is at a maximum. Since the lower level 403 is above the $E_{FV}$, electron-transition from the excited state to the ground state emitting a photon relaxes immediately down into the valence band. (2) Spectrally, the narrow optical gain due to rare earth transition will superimpose on top of the broad gain profile of the host semiconductor as shown in FIG. 6.

If optical feedback is provided by a pair of cleaved facets as in a conventional Fabry-Perot semiconductor laser, the gain at the rare earth ion transition wavelength will overcome the cavity losses first and attained lasing action. In an approximately 250-µm long semiconductor laser cavity, for example, at 1.55-µm wavelength, the longitudinal mode spacing is about 20 Å, and single-longitudinal mode operation will result at the rare earth ion transition wavelength as schematically shown in FIG. 6. Since this rare earth transition is atomic level in nature, a reproducible scheme of obtaining precisely the same lasing wavelength can be achieved from wafer to wafer, and device to device provided that the over-all gain at the rare earth transition wavelength is the highest. Furthermore, the wavelength of this line was found to shift with heat-sink temperature at a slow rate of about 1 Å/°C. due only to material dispersion of the host semiconductor. Other important consequences include the linewidth-narrowing due to atomic-level transition and immunity to external optical reflections.

Figure 1:
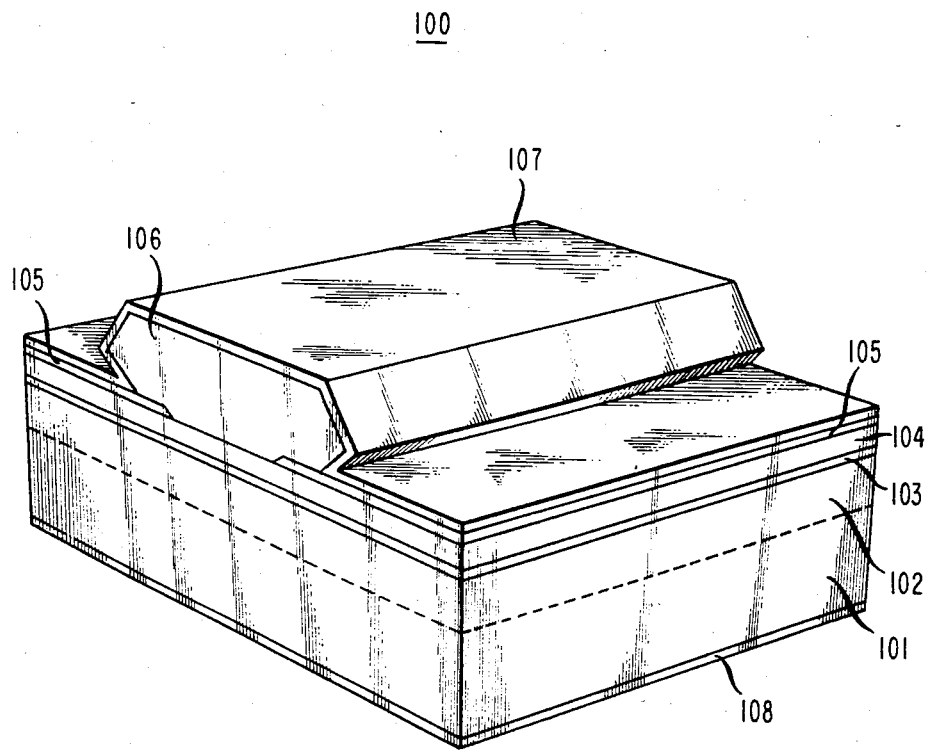
FIG. 1 is a pictorial illustration of a semiconductor laser constructed in accordance with the present invention.
Figure 2:
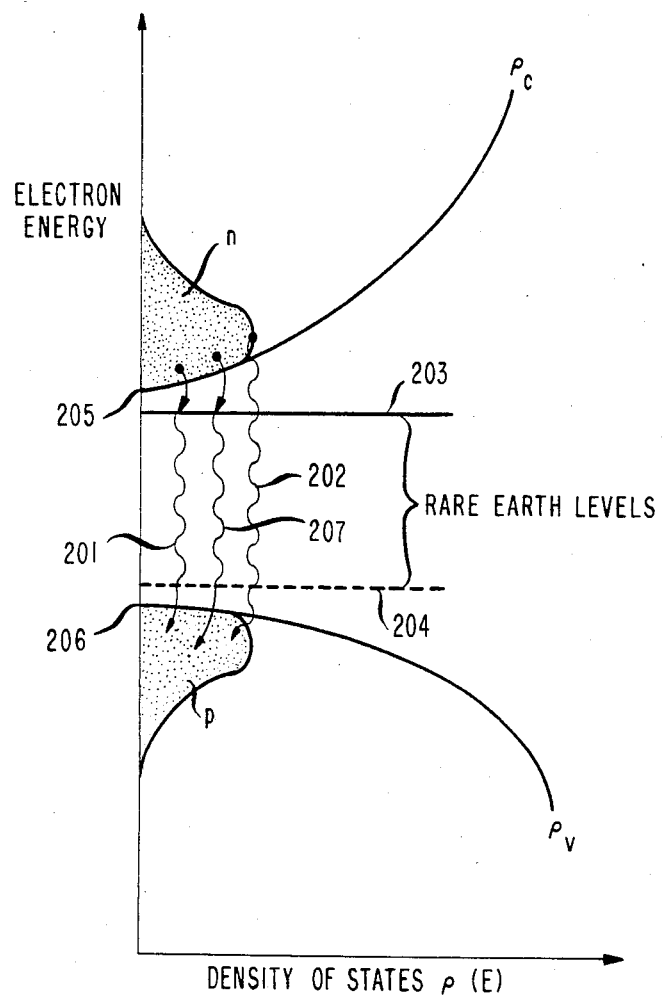
FIGS. 2 and 3 are an electron energy diagram and a gain plot useful in describing the operation of prior art doping of semiconductor materials using rare earth ions.
Figure 3:
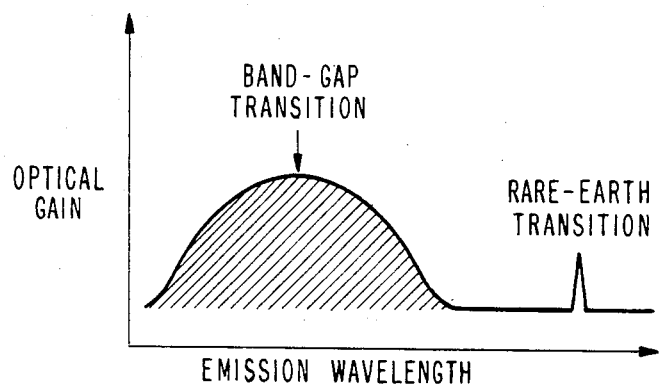

An embodiment of the invention was constructed employing a GaInAsP Hetero-epitaxial Ridge-Overgrown laser 100 of the type shown pictorially in FIG. 1. An n-type indium phosphide substrate 101 was placed in a liquid phase epitaxial growth apparatus and an n-type indium phosphide buffer layer 102 was grown on the substrate. This was followed by an n-type GaInAsP layer 103 in which the indium melt had been doped with about 0.5 percent by weight of erbium. The composition of the quaternary GaInAsP was chosen such that its bandgap corresponded to an emission wavelength of 1.55 µm. Layer 103 is followed by a p-type GaInAsP anti meltback layer 104. The composition of layer 104 is chosen such that its bandgap corresponded to an emission of about 1.3 µm. A silicon dioxide film 105 is then grown over layer 104 and a channel is etched in the silicon dioxide layer 105 thereby permitting a p-type InP ridge 106 to be grown over the channel. Finally the entire structure is covered with an ohmic contact 107 on the top and an ohmic contact 108 on the bottom of the substrate using standard ohmic contact formation. Using standard cleaving procedures a cavity laser diode of the type shown in FIG. 1 is fabricated. Each diode had a length of about 300 µm and its characteristics were tested at room temperature using 100 ns pulses at a repetition rate of about 1000 pulses per second. Similar hetero-epitaxial ridge overgrown lasers were described in the article entitled "A new high-power, narrow-beam transverse mode stabilized semiconductor laser at 1.5 µm: the heteroepitaxial ridge-overgrown laser", by W. T. Tsang and R. A. Logan, *Applied Physics Letters*, Vol, 45, pp. 1025-1027, 1984.

In operation, laser 100 is forward biased by a suitable energy source, such as a battery (not shown), connected across contacts 107 and 108. When the current supplied by the energy source exceeds the lasing threshold, stimulated coherent radiation is generated by radiative recombination of holes and electrons in layer 103. This radiation emanates from one or both of the end surfaces which may be cleaved or polished optically to form a cavity resonator.

Figure 7:
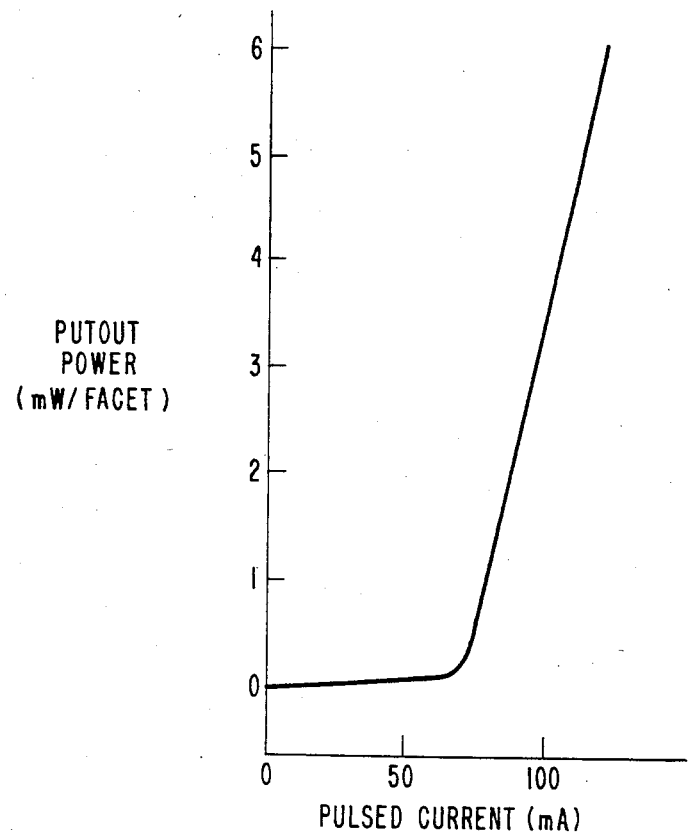
Figure 8:
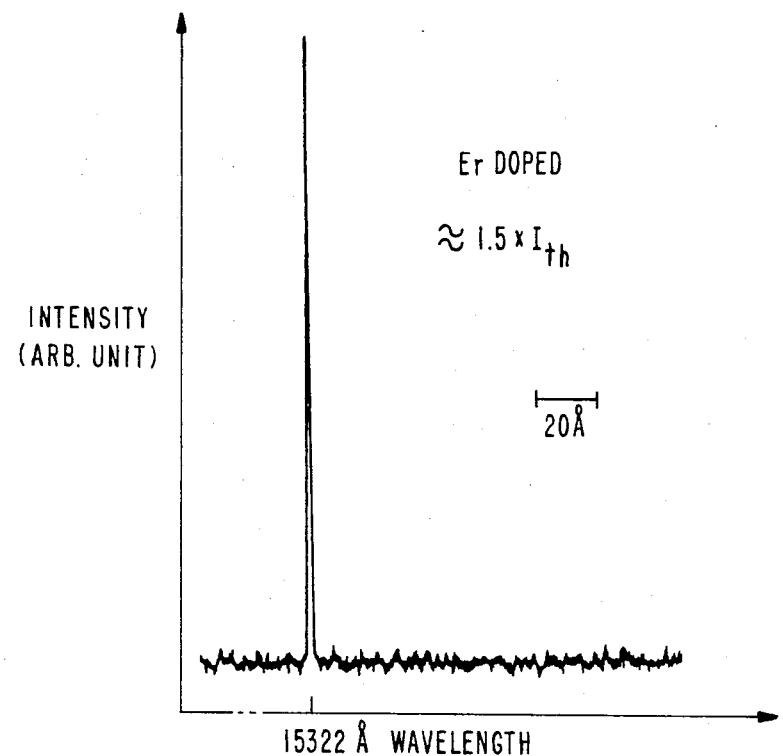

FIG. 7 shows the light-output versus pulsed current of a high-quality Er-doped diode of the type shown in FIG. 1. Er-doping did not appear to influence the threshold currents or output power provided that Er-concentration was not high enough to interfere with the epitaxial growth of uniform layers. In FIG. 8, the best spectra obtained in terms of single-longitudinal mode operation is shown. A side-mode suppression ratio of greater than 30 dB has been obtained. Further, it was found that the lasing wavelength was up-shifted to 15,322 Å instead of at the 15,500 Å expected from the GaInAsP quaternary composition. Two control (no Er) HRO laser wafers and two lasers with 0.5 percent by weight of Er-doping were grown over a period of several months. The control wafers without doping showed the typical wavelengths scatter of about 200 Å due to composition variation from intended nominal wavelength of 1.55 µm. On the other hand, both of the Er-doped laser wafers lased at almost exactly the same wavelength of 15,322 Å up-shifted from the 1.55 µm wavelength. Such exact reproduction of lasing wavelength of GaInAsP quaternary laser by LPE is very unlikely as also confirmed by the control wafers. An examination of several devices using Er-doping from within the same wafer yield a variation of about 30 Å equivalent to three longitudinal mode spacings. Such uncharacteristic behavior in Fabry-Perot semiconductor lasers strongly suggested that the energy transitions disclosed in FIGS. 4 and 5 are at work. An examination of $Er^{3+}$ transitions immediately shows that the $4_{I13/2}-4_{I15/2}$ transition will emit photons between 15,300 Å and 15,400 Å depending on the host materials.

Figure 9:
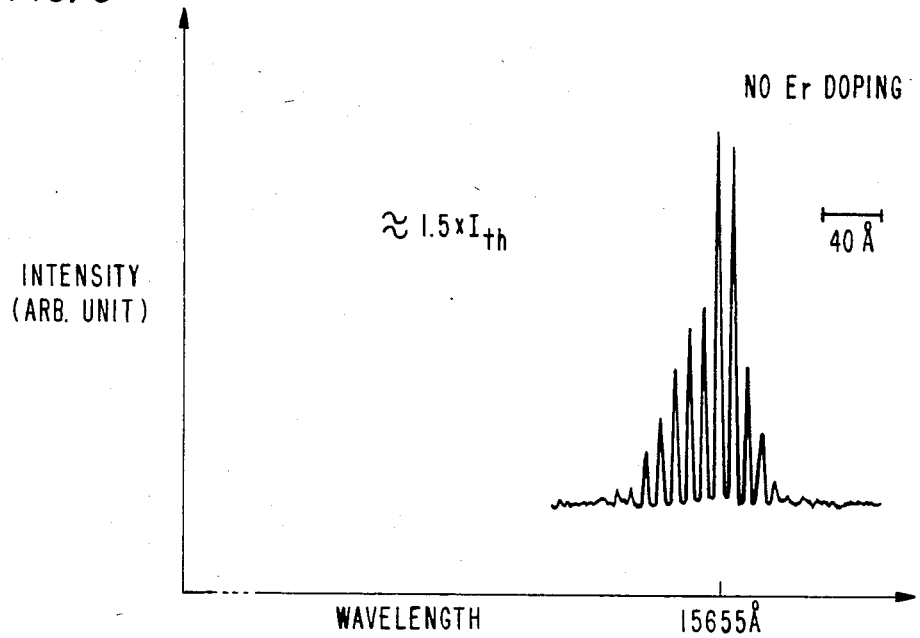

FIGS. 8 and 9 show a comparison of the lasing spectra for an Er-doped HRO laser and a control HRO laser at a current injection level of 1.5×threshold currents ($I_{th}$), respectively. Up to approximately $1.3-1.7\times I_{th}$, the Er-doped laser displaced quite clear single-longitudinal mode operation, while the control HRO laser shows the typical multi-longitudinal mode pattern right near threshold. Sometimes multi-longitudinal mode operation in addition to the $Er^{3+}$ lasing line was also observed in Er-doped diodes, such operation probably resulted from non-uniform Er-doping and/or composition variation from within the wafer. A spectrum at about $1.7 \times I_{th}$ (not shown) suggested that the gain peak due to $Er^{3+}$-line is probably located away from the gain peak of the GaInAsP host semiconductor resulting in simultaneously lasing at both peak locations under high current injection.

If this clean single-longitudinal mode is indeed due to the $Er^{3+}$ transition line, its wavelength shift with heat-sink temperature should be at a slow rate of about 1 Å/°C. due only to material dispersion. On the other hand, if it is due to band-edge transition of the host semiconductor, it should shift at a rate of about 5 Å/°C. due to bandgap variation with temperature. To show this in a most convincing manner, an Er-doped HRO diode was chosen that displayed simultaneous lasing at the assumed $Er^{3+}$-line (single-longitudinal) and at the broad band-edge transitions (multi-longitudinal) at room-temperature, and their respective rate of wavelength shift was observed with respect to heat-sink temperature. The peak of multi-longitudinal mode group exhibited the characteristic mode hopping of quaternary semiconductor lasers with an average rate of shift of about 6.5 Å/°C. On the other hand, the single-longitudinal mode shifted at a rate of 1.1 Å/°C. smoothly over the entire temperature range of about 20 degrees.

What has been described hereinabove is an illustrative embodiment of the present invention. Numerous departures may be made by those skilled in the art without departing from the spirit and scope of the present invention. For example, the semiconductor material can be silicon, germanium, or a compound whose elements are chosen from Columns II and VI or from Columns IV and VI of the Periodic Table of Elements. Suitable elements from Columns II and VI can be chosen from the group consisting of zinc, cadmium, mercury, sulfur, selenium and tellurium. Similarly, suitable elements from Columns IV and VI can be chosen from the group consisting of tin, lead, selenium and tellurium. In addition, other rare earth elements such as praseodymium, neodymium, europium, hoemium, thulium, or ytterbium may be substituted as a dopant in place of erbium.

What is claimed is:

1. A solid state laser comprising an active layer of semiconductor material arranged in a Fabry-Perot cavity, said semiconductor material having a bandgap between its valence band and its conduction band, and means comprising electrodes of the laser for electrically pumping said semiconductor active layer, characterized in that said semiconductor active layer includes a rare earth dopant having a dominant emission wavelength, and said semiconductor material is chosen such that said bandgap corresponds to a wavelength which is longer than said emission wavelength of the rare earth dopant.

2. A solid state laser as defined in claim 1 wherein said semiconductor material is a compound whose elements are chosen from Columns III and V of the Periodic Table of Elements.

3. A solid state laser as defined in claim 2 wherein the elements of said semiconductor material are from the group consisting of gallium, indium, aluminum arsenic, antimony and phosphorus.

4. A solid state laser as defined in claim 3 wherein the rare earth ion is erbium.

5. A solid state laser as defined in claim 1 wherein said semiconductor material is a compound whose elements are chosen from Columns II and VI of the Periodic Table of Elements.

6. A solid state laser as defined in claim 5 wherein the elements of said semiconductor material are from the group consisting of zinc, cadmium, mercury, sulfur, selenium, and tellurium.

7. A solid state laser as defined in claim 1 wherein said semiconductor material is a compound whose elements are chosen from Columns IV and VI of the Periodic Table of Elements.

8. A solid state laser as defined in claim 7 wherein the elements of said semiconductor material are from the group consisting of tin, lead, selenium and tellurium.

9. A solid state laser as defined in claim 1 wherein said semiconductor material is silicon or germanium.

10. A solid state laser comprising a substrate, a first cladding layer having a first conductivity type, an active layer having a bandgap between its valence band and its conduction band, a second cladding layer having a second conductivity type, a dielectric layer with a stripe opening exposing said second cladding layer, a ridge in said opening, and metallizations on said dielectric layer and ridge and on said substrate, the metallizations acting as electrodes for electrically pumping the active layer, characterized in that said active layer includes a rare earth dopant, the dominant emission from rare earth ion transitions being shorter in wavelength than that of the bandgap emission of the material of said active layer.

* * * * *